(12) United States Patent
Chang Chien et al.

(10) Patent No.: US 12,400,979 B2
(45) Date of Patent: Aug. 26, 2025

(54) INTEGRATED ANTENNA PACKAGE STRUCTURE AND MANUFACTURING METHOD THEREOF

(71) Applicant: Powertech Technology Inc., Hsinchu County (TW)

(72) Inventors: Shang-Yu Chang Chien, Hsinchu County (TW); Nan-Chun Lin, Hsinchu County (TW); Hung-Hsin Hsu, Hsinchu County (TW)

(73) Assignee: Powertech Technology Inc., Hsinchu County (TW)

( * ) Notice: Subject to any disclaimer, the term of this patent is extended or adjusted under 35 U.S.C. 154(b) by 430 days.

(21) Appl. No.: 18/071,632

(22) Filed: Nov. 30, 2022

(65) Prior Publication Data
US 2023/0197647 A1    Jun. 22, 2023

(30) Foreign Application Priority Data

Dec. 16, 2021   (TW) .................. 110147083

(51) Int. Cl.
*H01L 23/52* (2006.01)
*H01L 21/56* (2006.01)
(Continued)

(52) U.S. Cl.
CPC ............ *H01L 23/66* (2013.01); *H01L 21/561* (2013.01); *H01L 23/49838* (2013.01); *H01L 23/552* (2013.01); *H01L 24/16* (2013.01); *H01L 24/96* (2013.01); *H01L 24/97* (2013.01); *H01Q 1/2283* (2013.01); *H01Q 1/526* (2013.01); *H01L 23/49816* (2013.01); *H01L 23/49822* (2013.01); *H01L 2223/6616* (2013.01); *H01L 2223/6677* (2013.01); *H01L 2224/16225* (2013.01); *H01L 2224/95001* (2013.01); *H01L 2224/96* (2013.01); *H01L 2224/97* (2013.01);
(Continued)

(58) Field of Classification Search
None
See application file for complete search history.

(56) References Cited

U.S. PATENT DOCUMENTS

2013/0015564 A1* 1/2013 Matsuki ............... H01Q 1/2283
                                                        257/E23.114
2018/0277457 A1   9/2018 Endo
(Continued)

FOREIGN PATENT DOCUMENTS

TW        201347103     11/2013
TW        M515702       1/2016

*Primary Examiner* — Nicholas J Tobergte
(74) *Attorney, Agent, or Firm* — JCIPRNET

(57) ABSTRACT

Provided is an integrated antenna package structure including a chip, a circuit structure, a shielding body, an encapsulant, a first antenna layer, a dielectric body, and a second antenna layer. The circuit structure is electrically connected to the chip. The shielding body is disposed on the circuit structure and has an accommodating space. The chip is disposed in the accommodating space of the shielding body. The encapsulant is disposed on the circuit structure and covers the chip. The first antenna layer is disposed on the circuit structure and is electrically connected to the circuit structure. The dielectric body is disposed on the encapsulant. The second antenna layer is disposed on the dielectric body. A manufacturing method of the integrated antenna package structure is also provided.

17 Claims, 7 Drawing Sheets

(51) Int. Cl.
  *H01L 23/00*   (2006.01)
  *H01L 23/498*  (2006.01)
  *H01L 23/552*  (2006.01)
  *H01L 23/66*   (2006.01)
  *H01Q 1/22*   (2006.01)
  *H01Q 1/52*   (2006.01)

(52) U.S. Cl.
  CPC ................ *H01L 2924/1421* (2013.01); *H01L 2924/3025* (2013.01)

(56) References Cited

U.S. PATENT DOCUMENTS

2021/0242593 A1  8/2021 Im
2021/0273315 A1* 9/2021 Cheng ................ H01L 23/5385

\* cited by examiner

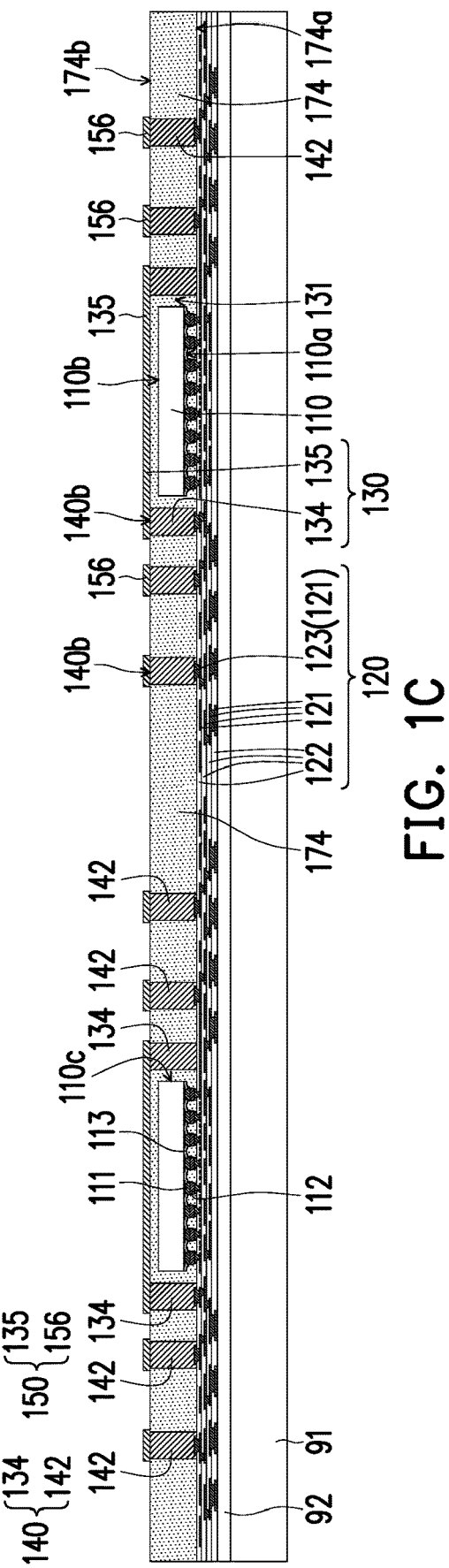
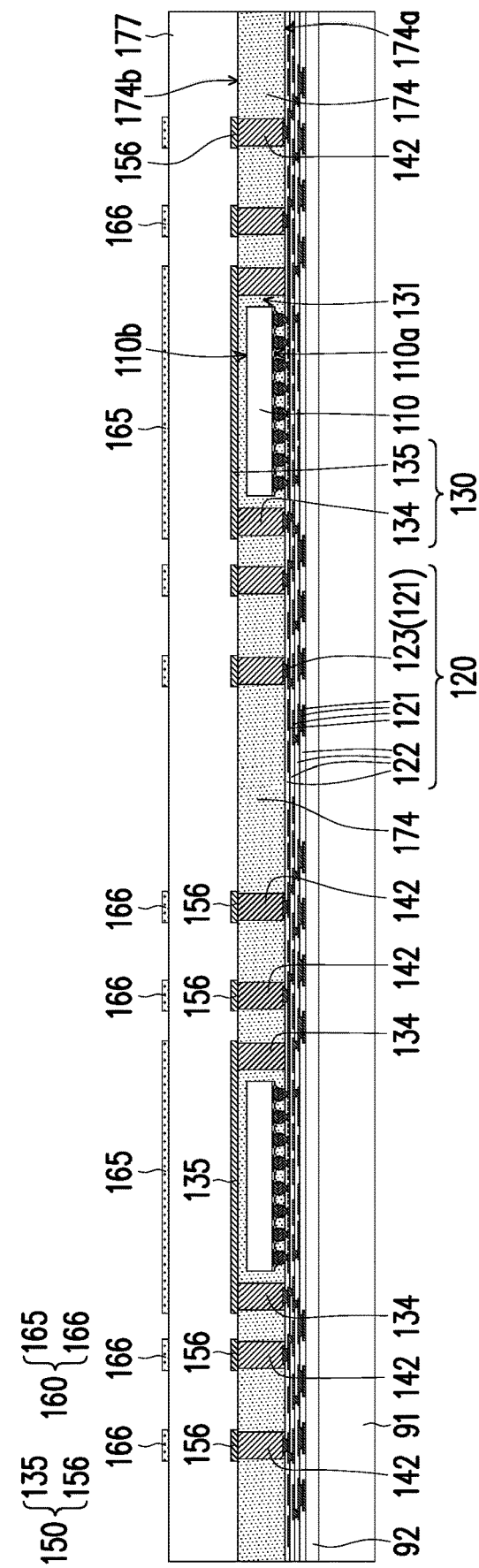

INTEGRATED ANTENNA PACKAGE STRUCTURE AND MANUFACTURING METHOD THEREOF

CROSS-REFERENCE TO RELATED APPLICATION

This application claims the priority benefit of Taiwan application no. 110147083, filed on Dec. 16, 2021. The entirety of the above-mentioned patent application is hereby incorporated by reference herein and made part of this specification.

BACKGROUND

Technical Field

The disclosure relates to a package structure and a manufacturing method thereof, particularly to an integrated antenna package structure and a manufacturing method thereof.

Description of Related Art

With the advancement of technology, electronic products are packed with more functionalities than ever. For example, a mobile communication device nowadays is provided with various electronic components with different functions that are each small in size to trend toward lightness and thinness. In the existing electronic assembly, the antenna is separated from the chip package structure, and the antenna needs to be electrically connected to the chip in the package structure through the circuit on the circuit board, which makes it difficult to reduce the overall volume of the electronic assembly. In this light, it is an urgent task to solve this problem.

SUMMARY

The disclosure is directed to an integrated antenna package structure with small volume and/or good quality and a manufacturing method thereof.

According to an embodiment of the disclosure, an integrated antenna package structure includes a chip, a circuit structure, a shielding body, an encapsulant, a first antenna layer, a dielectric body, and a second antenna layer. The circuit structure is electrically connected to the chip. The shielding body is disposed on the circuit structure and has an accommodating space. The chip is disposed in the accommodating space of the shielding body. The encapsulant is disposed on the circuit structure and covers the chip. The first antenna layer is disposed on the circuit structure and is electrically connected to the circuit structure. The dielectric body is disposed on the encapsulant. The second antenna layer is on the dielectric body.

According to an embodiment of the disclosure, a manufacturing method of an integrated antenna package structure includes the following processes. A circuit structure is formed. A chip is disposed on the circuit structure to be electrically connected with the circuit structure. A shielding body is formed on the circuit structure, in which the shielding body has an accommodating space, and the chip is disposed in the accommodating space of the shielding body. An encapsulant is formed on the circuit structure to cover the chip. A first antenna layer is formed on the circuit structure to be electrically connected with the circuit structure. A dielectric body is formed on the encapsulant. And a second antenna layer is formed on the dielectric body.

Based on the above, the integrated antenna package structure and the manufacturing method thereof of the disclosure have a smaller volume and/or better quality.

BRIEF DESCRIPTION OF THE DRAWING

FIG. 1A to FIG. 1F are partial cross-sectional schematic diagrams of part of a manufacturing method of an integrated antenna package structure according to a first embodiment of the disclosure.

DESCRIPTION OF THE EMBODIMENTS

Figure 1A:
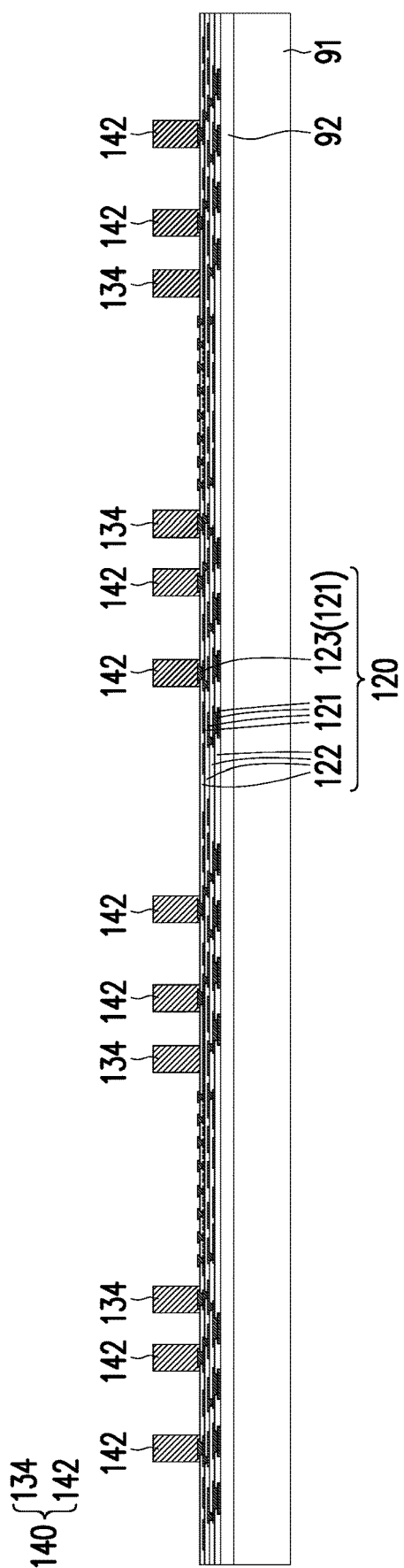

Reference is made hereinafter in detail to the embodiments of the disclosure, examples of which are illustrated in the drawings. Wherever possible, the same reference numbers in the drawings and description refer to the same or similar parts.

Unless expressly stated otherwise, directional terms (e.g., top, down, left, right, front, back, top, and bottom) herein are for reference only for the drawings and are not intended to imply absolute orientation.

Unless explicitly stated otherwise, any process described herein shall not to be construed as to be performed in a particular order.

Despite that the disclosure is more fully explained with reference to the drawings of the embodiments, the disclosure can be embodied in various forms and should not be limited to the embodiments described herein. The thicknesses, sizes, or dimensions of layers or areas in the drawings may be exaggerated for clarity.

FIG. 1A to FIG. 1F are partial cross-sectional schematic views of part of a manufacturing method of a chip package structure according to a first embodiment of the disclosure.

As shown in FIG. 1A, a circuit structure 120 is formed on a carrier 91. There is no particular limitation on the carrier 91 in the disclosure, as long as the carrier 91 is suitable for carrying the film layer formed thereon or the components disposed thereon.

In one embodiment, the carrier 91 has a release layer 92, but the disclosure is not limited thereto. The release layer 92 includes a light-to-heat conversion (LTHC) adhesive layer or other film layers suitable.

In this embodiment, the circuit structure 120 includes an insulating layer 122 and a conductive layer 121. The conductive layer 121 constitutes corresponding circuits. The layout design of the circuit may be adjusted according to requirements, which is not limited in the disclosure. For example, in the circuits of the circuit structure 120, the parts that are not connected in the drawings are electrically connected by other elements not shown and/or other conductive components.

In this embodiment, as the circuit structure 120 is formed by common semiconductor processes (e.g., deposition process, photolithography process, and/or etching process), it is not repeated herein.

In one embodiment, the circuit structure 120 may be referred to as a redistribution circuit structure, but the disclosure is not limited thereto.

In one embodiment, the topmost conductive layer 123 (i.e., the layer of the conductive layer 121 farthest from the carrier 91) is disposed on the topmost insulating layer 122, and part of the topmost conductive layer 123 is embedded in the topmost insulating layer 122.

In an embodiment not shown, the topmost insulating layer 122 has a plurality of openings, and the openings expose the conductive layer 121 farthest from the carrier 91.

As shown in FIG. 1A, the conductive member 140 is formed on the circuit structure 120. At least part of the conductive member 140 is electrically connected to a corresponding part of the topmost conductive layer 123. The conductive member 140 includes a pillar-shaped conductive member 142 and a frame-shaped conductive member 134. In one embodiment, the frame-shaped conductive member 134 includes a frame-shaped area and other areas extending outward from the frame-shaped area. In other words, as long as the frame-shaped conductive member 134 has an area for an object to be placed therein (such as the chip 110 described in the subsequent FIG. 1B, but it is not limited thereto), and the disclosure does not limit the appearance of the frame-shaped conductive member 134.

In one embodiment, the conductive member 140 includes a pre-formed conductive member. For example, the conductive member 140 includes a pre-formed conductive pillar or a pre-formed conductive frame, but the disclosure is not limited thereto.

In one embodiment, the conductive member 140 is formed by common semiconductor processes (e.g., a photolithography process, a sputtering process, an electroplating process, and/or an etching process), but the disclosure is not limited thereto. In one embodiment, the conductive member 140 includes a plating core layer and a seed layer, but the disclosure is not limited thereto. The seed layer is disposed between the topmost conductive layer 123 and the plating core layer. In one embodiment, the seed layer surrounds the plating core layer, but the disclosure is not limited thereto.

Figure 1B:
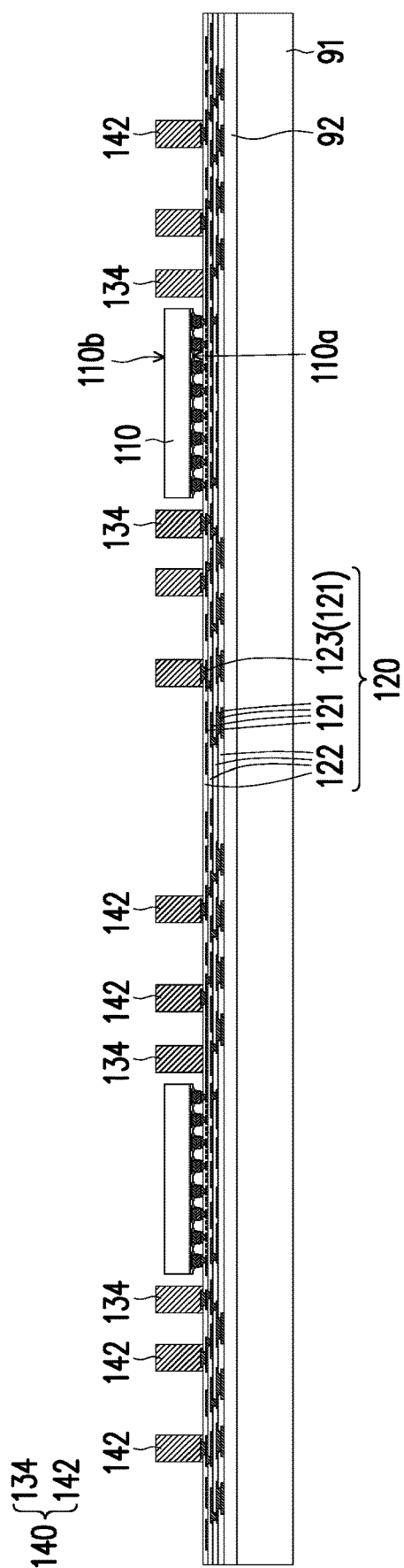

As shown in FIG. 1B, the chip 110 is disposed on the circuit structure 120. There is a component area (not shown) on one side of the chip 110, and the surface on which the component area is disposed may be referred to as an active surface 110a, and the other surface opposite to the active surface 110a may be referred to as a backside 110b. The chip 110 is disposed on the circuit structure 120 with its active surface 110a facing the circuit structure 120. And the components in the chip 110 are electrically connected with the corresponding circuits in the circuit structure 120.

In this embodiment, the conductive member 140 is formed first, as shown in FIG. 1A, before the chip 110 is disposed, as shown in FIG. 1B.

In an embodiment not shown, the chip 110 is configured first, before the conductive member 140 is formed.

Notably, the backside 110b of the chip 110 may be considered part of the chip 110 if there are suitable films, layers, and/or components on the backside 110b of the chip 110 prior to disposing the chip 110 on the circuit structure 120.

As shown in FIG. 1C, after the conductive member 140 is formed and the chip 110 is disposed, an encapsulant 174 is formed on the carrier 91. The encapsulant 174 directly covers at least the backside 110b of the chip 110, and the encapsulant 174 exposes the conductive member 140.

The encapsulant 174 has a first sealing surface 174a and a second sealing surface 174b. The second sealing surface 174b is opposite to the first sealing surface 174a. The first sealing surface 174a of the encapsulant 174 faces the circuit structure 120. The encapsulant 174 may completely cover the entire backside 110b and the entire side surface 110c of the chip 110, but the disclosure is not limited thereto.

For example, a molding material is formed on the carrier 91. After the molding material is cured, a planarization process may be performed. And after the planarization process is performed, the conductive member 140 may be exposed from the encapsulant 174. In other words, the second sealing surface 174b of the encapsulant 174 may be coplanar with the upper surface 140b of the conductive member 140 (i.e., the surface of the conductive member 140 farthest from the circuit structure 120). During the planarization process, a portion of the cured molding material and/or a portion of the conductive members 140 may be slightly removed.

In this embodiment, part of the encapsulant 174 is disposed between the chip 110 and the circuit structure 120. For example, the chip 110 is electrically connected to the corresponding circuit in the circuit structure 120 through corresponding conductive bumps 112, and part of the encapsulant 174 disposed between the chip 110 and the circuit structure 120 may cover the conductive bumps 112. That is, it is possible that the first sealing surface 174a of the encapsulant 174 is not coplanar with the active surface 110a of the chip 110, the contact pad 111 (e.g., die pad) on the chip 110, and/or the passivation layer 113 on the chip 110, but the disclosure is not limited thereto.

As shown in FIG. 1C, in this embodiment, after the encapsulant 174 is formed, the conductive layer 150 is formed on the second sealing surface 174b of the encapsulant 174. The conductive layer 150 includes a first antenna layer 156 and a conductive portion 135 different from the first antenna layer 156 aforementioned. The conductive layer 150 is formed by common semiconductor processes (e.g., deposition process, photolithography process and/or etching process; or screen printing), which are not limited in the disclosure.

The antenna pattern of the first antenna layer 156 may be adjusted according to design requirements, which is not limited in the disclosure.

The conductive portion 135 (which is also known as the second conductive portion 135) and the frame-shaped conductive member 134 (which is also known as the first conductive portion 134) are electrically connected (or even in direct contact), so as to constitute the shielding body 130.

In this embodiment, the bottom surface of the conductive layer 150, the second sealing surface 174b of the encapsulant 174, and the upper surface 140b of the conductive member 140 may be coplanar. In other words, the conductive layer 150 directly contacts a corresponding part of the encapsulant 174 and/or the corresponding conductive member 140. That is, in a direction perpendicular to the first sealing surface 174a or the second sealing surface 174b, there is basically no other substance between the conductive layer 150 and the encapsulant 174, and/or there is basically no other substance between the conductive layer 150 and the conductive member 140. As such, the process is relatively simple accordingly.

In this embodiment, in a direction perpendicular to the first sealing surface 174a or the second sealing surface 174b, there is only the encapsulant 174 between the entire backside 110b of the chip 110 and the second conductive portion 135. With the above process, the part where the encapsulant 174 is between the chip 110 and the second conductive portion 135 is able to provide sufficient protection and/or separation, which allows other substances or film layers (e.g., Die Attach Film (DAF)) between the chip 110 and the second conductive portion 135 to be omitted, and the thickness of the structure may be reduced accordingly; and/or, the process may be relatively simple.

As shown in FIG. 1D, after the encapsulant 174 and the conductive layer 150 are formed, a dielectric body 177 is formed on the encapsulant 174.

In this embodiment, a semi-cured dielectric material is coated on the encapsulant 174. Also, after the dielectric material is cured, a corresponding dielectric body 177 is formed. The dielectric material includes, but is not limited to, a polymer material (e.g., polyimide (PI)).

In an embodiment not shown, a cured or solid dielectric material (including, but not limited to, glass, polymer plate, or polymer film) is disposed on the encapsulant 174. The cured or solid dielectric material and the encapsulant 174 may be connected to each other by an insulating adhesive material to form the dielectric body 177 correspondingly.

Furthermore, in FIG. 1D, after the dielectric body 177 is formed, a conductive layer 160 is formed on the dielectric body 177. The conductive layer 160 at least includes the second antenna layer 166. The conductive layer 160 is formed by common semiconductor processes (such as deposition process, photolithography process, and/or etching process; or screen printing), which is not limited in the disclosure.

In this embodiment, the conductive layer 160 includes a second antenna layer 166 and a shielding layer 165.

Figure 1E:
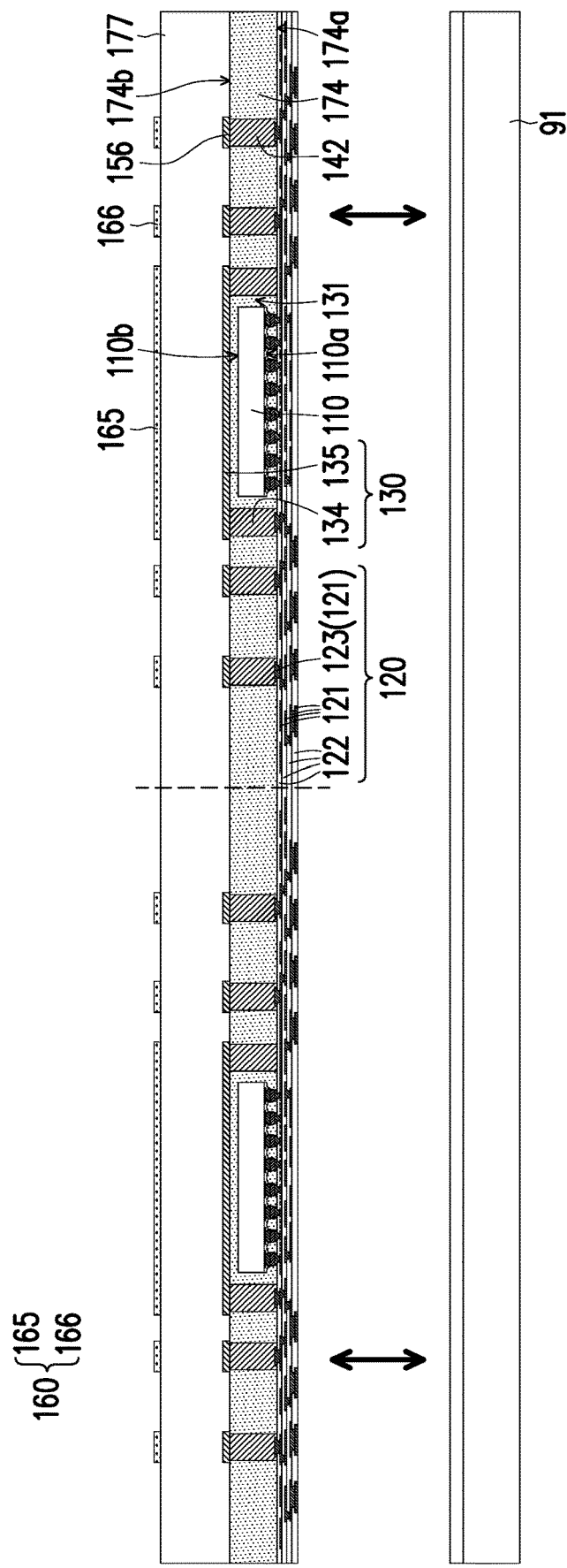

As shown in FIG. 1E, after the conductive layer 160 is formed, the carrier 91 may be removed.

Figure 1F:
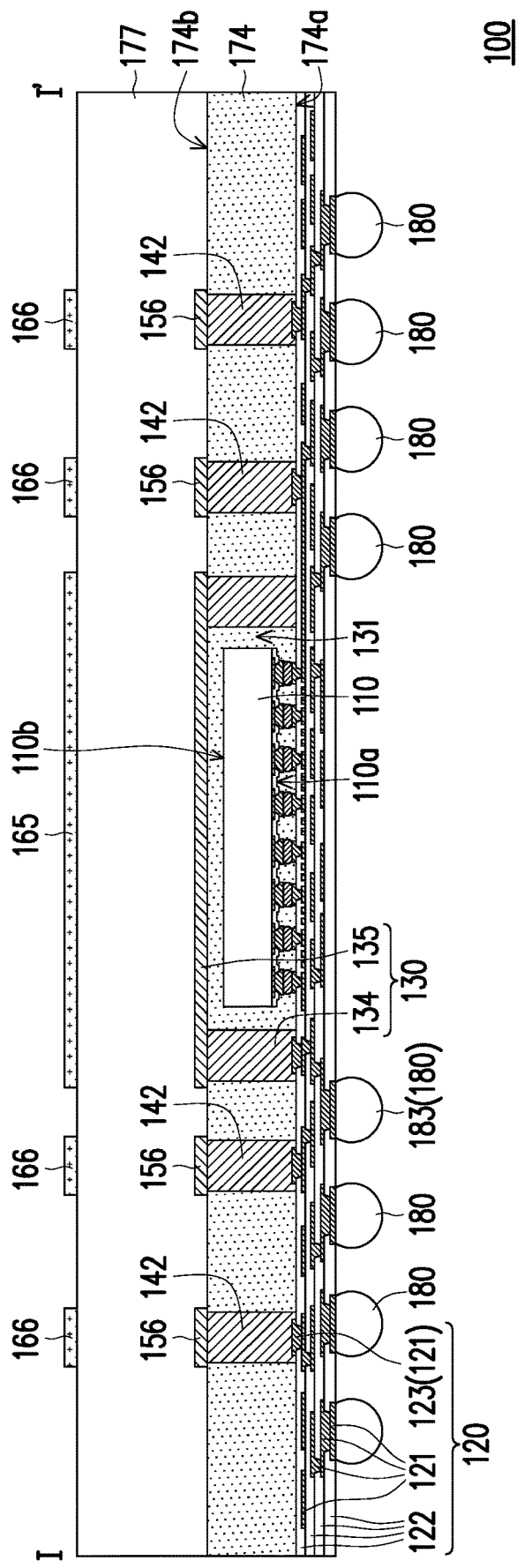

Please refer to FIG. 1E to FIG. 1F. A singulation process/dicing process or other suitable process may be performed on the structure shown in 1E to form a plurality of integrated antenna package structures 100 shown in FIG. 1F. The singulation process at least cuts the circuit structure 120, the encapsulant 174, and/or the dielectric body 177.

It is worth noting that after the singulation process is performed, the singulated elements still adopt similar reference numbers. For example, the chip 110 (shown in FIG. 1E) may be the chip 110 after singulation (shown in FIG. 1F); the circuit structure 120 (shown in FIG. 1E) may be the circuit structure 120 after singulation (as shown in FIG. 1F); the encapsulant 174 (shown in FIG. 1E) may be the encapsulant 174 after singulation (shown in FIG. 1F); and the dielectric body 177 (shown in FIG. 1E) may be the dielectric body 177 after singulation (shown in FIG. 1F). The description for the singulated films, layers, or components with the same reference number is not repeated or specifically shown hereinafter.

It should be noted that, in this embodiment, the carrier 91 is removed first, before a singulation process or other suitable processes for forming the integrated antenna package structures 100 are performed. In an embodiment not shown, the singulation process is performed on the structures on the carrier 91 first, and after the carrier 91 is removed, the integrated antenna package structures 100 are then formed.

As shown in FIG. 1F, in this embodiment, after the carrier 91 is removed, a plurality of conductive terminals 180 are formed on the circuit structure 120 to form the corresponding integrated antenna package structure 100.

In one embodiment, the carrier 91 is removed first, and a plurality of conductive terminals 180 are then formed, and then a singulation process is performed. In one embodiment, the singulation process is performed first, then the carrier 91 is removed, and then the conductive terminals 180 are formed.

After the above processes, the fabrication of the integrated antenna package structure 100 of this embodiment may be considered substantially completed.

Figure 1G:
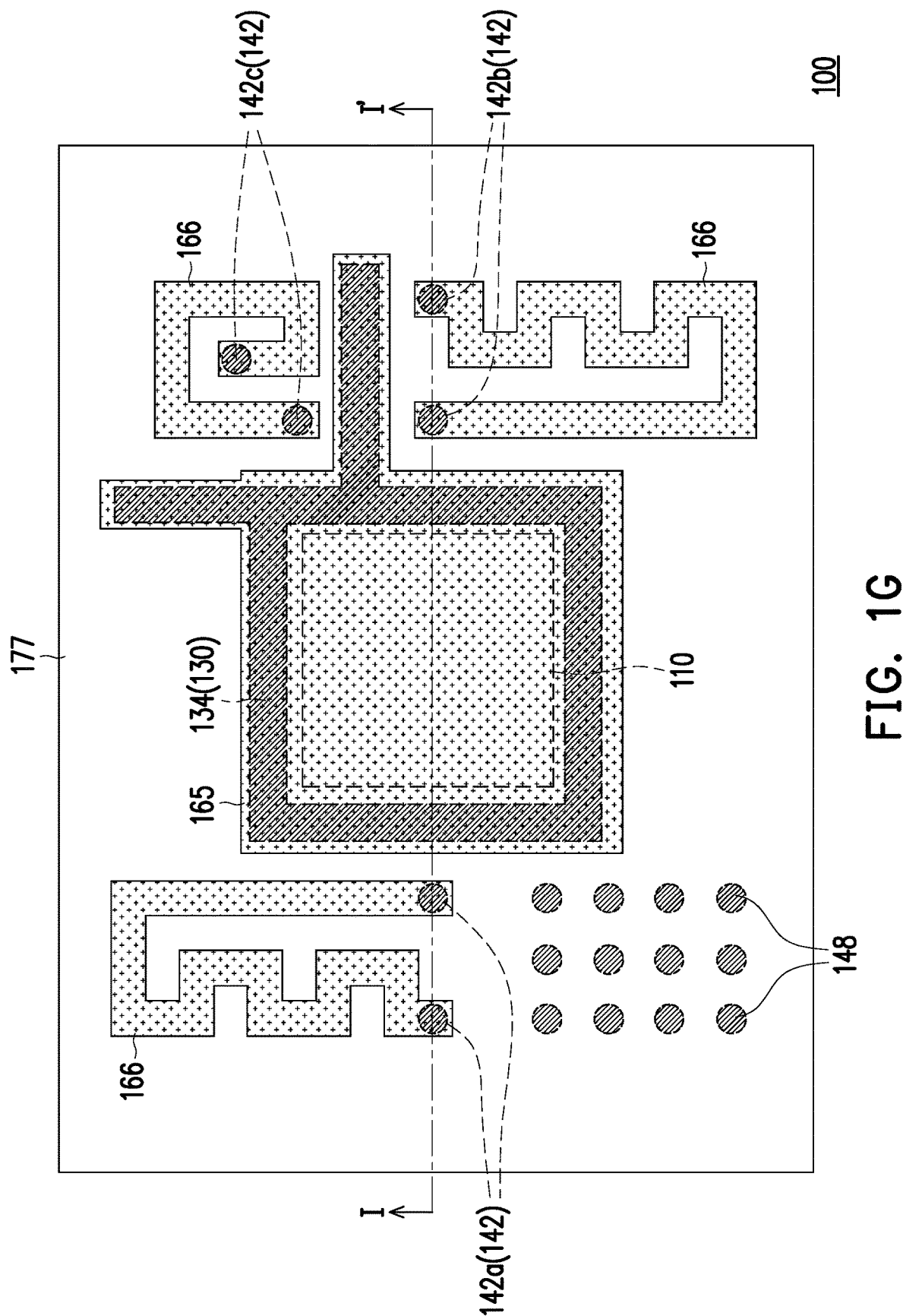
FIG. 1G is a schematic partial top view of the integrated antenna package structure according to the first embodiment of the disclosure.

FIG. 1F is a partial cross-sectional schematic diagram of a package structure of a chip 110 according to the first embodiment of the disclosure. FIG. 1G is a schematic partial top view of a package structure of a chip 110 according to the first embodiment of the disclosure. For example, FIG. 1F may be a schematic cross-sectional view corresponding to the line I-I' in FIG. 1G. In addition, for the sake of clarity, only part of the film layers or members is shown in FIG. 1G. For example, FIG. 1G only shows exemplarily the dielectric body 177, the shielding layer 165, or the second antenna layer 166; and, the chip 110, the first conductive portion 134, the conductive member 142, or the support member 148 are also shown in perspective.

Please refer to FIG. 1F and FIG. 1G. The integrated antenna package structure 100 includes a chip 110, a circuit structure 120, a shielding body 130, an encapsulant 174, a first antenna layer 156, a dielectric body 177, and a second antenna layer 166. The chip 110 is electrically connected to the corresponding circuit in the circuit structure 120. The shielding body 130 is disposed on the circuit structure 120. The shielding body 130 has an accommodating space 131. The chip 110 is disposed in the accommodating space 131 of the shielding body 130. The encapsulant 174 is disposed on the circuit structure 120 and covers the chip 110. The first antenna layer 156 is disposed on the circuit structure 120. The first antenna layer 156 may be further disposed on the encapsulant 174. Antennas in the first antenna layer 156 are electrically connected to corresponding circuits in the circuit structure 120. The dielectric body 177 is disposed on the second sealing surface 174b of the encapsulant 174. The second antenna layer 166 is on the dielectric body 177.

In this embodiment, in the thickness direction of the integrated antenna package structure 100 (e.g., the normal direction of the sealing surface 174a or the sealing surface 174b), the second antenna layer 166 overlaps the first antenna layer 156, and the dielectric body 177 is disposed between the first antenna layer 156 and the second antenna layer 166.

In this embodiment, the shielding body 130 includes a first conductive portion 134 and a second conductive portion 135. The first conductive portion 134 and the second conductive portion 135 constitute the accommodating space 131. The first conductive portion 134 penetrates through the encapsulant 174 and surrounds the chip 110. The second conductive portion 135 is disposed on the second sealing surface 174b of the encapsulant 174. The second conductive portion 135 overlaps the chip 110 in a direction perpendicular to the first sealing surface 174a or the second sealing surface 174b (as shown in FIG. 1G). In this way, the interference between the chip 110 and the antenna may be reduced.

In one embodiment, the first conductive portion 134, the second conductive portion 135, and the circuit structure 120 constitute a closed accommodating space 131. That is to say, the components (e.g., the conductive member 142) for electrically connecting the circuit structure 120 and the first antenna layer 156 are disposed outside the closed accommodating space 131. That is, the components (e.g., the conductive member 142) for electrically connecting the circuit structure 120 and the first antenna layer 156 do not penetrate through the closed accommodating space 131.

In one embodiment, the shielding body 130 is grounded. Grounding includes a floating ground or a physical ground. For example, the shielding body 130 is grounded through a ground circuit and a ground terminal 183 (one of the conductive terminals 180) in the circuit structure 120.

In one embodiment, the projection of the first conductive portion 134 on the first sealing surface 174*a* or the second sealing surface 174*b* is within the projection of the second conductive portion 135 on the first sealing surface 174*a* or the second sealing surface 174*b* to provide a better process window.

In this embodiment, the integrated antenna package structure 100 further includes a pillar-shaped conductive connector 142. The conductive connector 142 penetrates through the encapsulant 174. Antennas in the first antenna layer 156 are electrically connected to corresponding circuits in the circuit structure 120 through corresponding conductive connectors 142.

In one embodiment, the first conductive portion 134 of the shielding body 130 and the conductive connector 142 are formed by the same process. In other words, the materials of the first conductive portion 134 and the conductive connector 142 are substantially the same, and the thickness of the first conductive portion 134 and that of the conductive connector 142 are also substantially the same.

In one embodiment, if the first antenna layer 156 has a plurality of antennas that are electrically separated from each other, the shielding body 130 is disposed between those antennas in a direction parallel to the first sealing surface 174*a* or the second sealing surface 174*b*. For example, the second conductive portion 135 of the shielding body 130 is disposed between those antennas. In this way, the interference between the antennas may be reduced, thereby improving the application of the antenna-integrated package structure 100 and/or the corresponding signal quality.

In one embodiment, if the first antenna layer 156 has a plurality of antennas that are electrically separated from each other, the shielding body 130 is disposed between the conductive connectors 142 for connecting the antennas in a direction parallel to the first sealing surface 174*a* or the second sealing surface 174*b*. For example, the first conductive portion 134 of the shielding body 130 may be disposed between the conductive connectors 142 for connecting the antennas. For another example, the shielding body 130 may be disposed between the conductive connector 142*a* and the conductive connector 142*b*, the shielding body 130 is disposed between the conductive connector 142*b* and the conductive connector 142*c*, and/or the shielding body 130 is disposed between the conductive connector 142*a* and the conductive connector 142*c*. In this way, the interference between the antennas may be reduced, thereby improving the application of the antenna-integrated package structure 100 and/or the corresponding signal quality.

In one embodiment, if the first antenna layer 156 has a plurality of antennas that are electrically separated from each other, the shielding body 130 is disposed between the conductive connectors 142 for connecting different two antennas in any direction parallel to the first sealing surface 174*a* or the second sealing surface 174*b*.

In this embodiment, the antenna pattern of the second antenna layer 166 corresponds to the antenna pattern of the first antenna layer 156. That is to say, in a direction (e.g., the thickness direction) perpendicular to the first sealing surface 174*a* or the second sealing surface 174*b*, the antenna pattern of the second antenna layer 166 does not overlap the chip 110; or further, the antenna pattern of the second antenna layer 166 does not overlap the shielding body 130. As such, the interference between the antenna and the chip 110 may be reduced, thereby improving the application of the antenna-integrated package structure 100 and/or the corresponding signal quality.

In one embodiment, antennas in the first antenna layer 156 are coupled with the corresponding antennas in the second antenna layer 166, and the coupled antennas are not electrically connected. In an exemplary application, an antenna corresponding to the first antenna layer 156 is a driven antenna, and a corresponding antenna in the second antenna layer 166 is a parasitic antenna, but the disclosure is not limited thereto.

In this embodiment, the integrated antenna package structure 100 further includes a shielding layer 165. The shielding layer 165 is disposed on the dielectric body 177. The shielding layer 165 overlaps the chip 110 in a direction perpendicular to the first sealing surface 174*a* or the second sealing surface 174*b*. In this way, the interference of external electromagnetic waves to the chip 110 may be reduced.

In one embodiment, the pattern of the shielding layer 165 overlaps or corresponds to the pattern of the second conductive portion 135, which improves the shielding quality of the shielding layer 165.

In one embodiment, as shown in FIG. 1G, the projection of the chip 110 on the first sealing surface 174*a* or the second sealing surface 174*b* is within the projection of the shielding layer 165 on the first sealing surface 174*a* or the second sealing surface 174*b*, and the projection of the chip 110 on the first sealing surface 174*a* or the second sealing surface 174*b* completely overlaps the projection of the shielding layer 165 on the first sealing surface 174*a* or the second sealing surface 174*b*. In this way, the interference of external electromagnetic waves to the chip 110 may be reduced.

In one embodiment, if the first antenna layer 156 or the second antenna layer 166 has multiple antennas that are electrically separated from each other (e.g., driven antennas that are electrically separated from each other; or, parasitic antennas that are electrically separated from each other); and the shielding layer 165 is disposed between the antennas formed by the second antenna layer 166 in a direction parallel to the first sealing surface 174*a* or the second sealing surface 174*b*. In this way, the interference between the antennas may be reduced, thereby improving the application of the antenna-integrated package structure 100 and/or the corresponding signal quality.

In one embodiment, if the first antenna layer 156 or the second antenna layer 166 has multiple antennas that are electrically separated from each other (e.g., driven antennas that are electrically separated from each other; or, parasitic antennas electrically separated from each other), the shielding layer 165 is disposed between the antennas formed by the second antenna layer 166 in any direction parallel to the first sealing surface 174*a* or the second sealing surface 174*b*.

In one embodiment, the shielding layer 165 is grounded, but the disclosure is not limited thereto. For example, the grounding of the shielding layer 165 is floating.

In one embodiment, in terms of electrical properties, the shielding layer 165 and the second conductive portion 135 are not electrically connected to each other. In one embodiment, there is no conductive substance between the shielding layer 165 and the second conductive portion 135 structurally.

In one embodiment, the width (i.e., another dimension perpendicular to the direction in which the shielding layer 165 has the largest dimension) of the shielding layer 165 is larger than the width of any antenna in the second antenna layer 166 (i.e., the dimension perpendicular to the extending direction of the antenna). As such, with the relatively simple pattern design mentioned above (e.g., adjusting the width of the shielding layer 165), other components and/or processes may be omitted (for example, the shielding layer 165 does not need to be electrically connected to other conductors in the integrated antenna package structure 100 to be grounded), but the overall charge capacity of the shielding layer 165 may still be improved, such that the shielding layer 165 has a good shielding effect.

In one embodiment, the projection area of the shielding layer 165 on the surface of the dielectric body 177 is larger than the projection area of the second antenna layer 166 on the surface of the dielectric body 177, thereby improving the overall charge capacity of the shielding layer 165, and the shielding layer 165 has a good shielding effect.

In this embodiment, the integrated antenna package structure 100 further includes a support member 148. The support member 148 may penetrate through the encapsulant 174. The material, appearance, and/or manufacturing technique of the support member 148 may be the same as those of the conductive connector 142; however, in this embodiment, the support member 148 does not overlap the first antenna layer 156 and/or the second antenna layer 166 in a direction perpendicular to the first sealing surface 174a or the second sealing surface 174b.

The arrangement or the quantity of the support members 148 may be adjusted according to the design requirements, which is not limited in the disclosure. For example, the support members 148 may be disposed where the conductive connectors 142 are relatively sparse, such that the corresponding structure or stress bearing may be well balanced in the manufacturing process and/or application of the integrated antenna package structure 100.

In one embodiment, the support member 148 is a dummy component for signal processing or signal transmission of the integrated antenna package structure 100. In other words, the support member 148 may substantially not participate in signal processing or signal transmission.

Note that the disclosure does not limit the support member 148 to not be electrically connected to any conductor. For example, in an embodiment not directly shown, the support member 148 is electrically connected to the shielding body 130 through a corresponding circuit in the circuit structure 120, as a way to improve the overall charge capacity of the shielding body 130 and the conductors (e.g., the conductive member 140 and/or the support member 148) electrically connected thereto.

Figure 2:
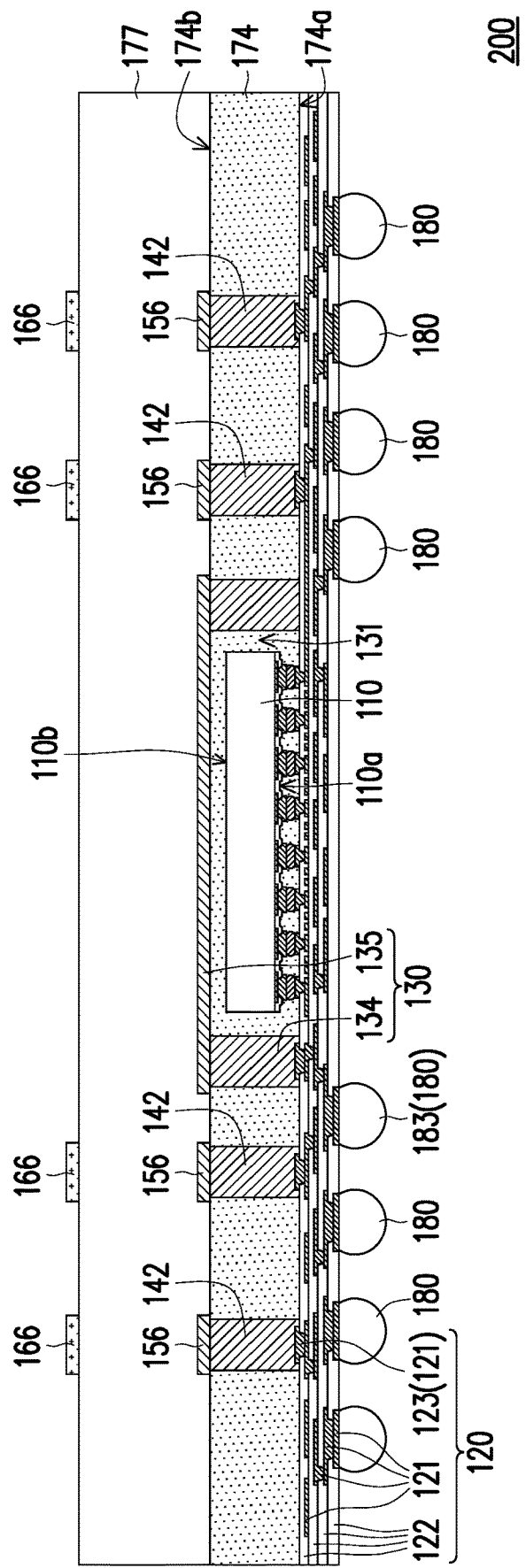
FIG. 2 is a partial cross-sectional schematic diagram of part of a manufacturing method of an integrated antenna package structure according to a second embodiment of the disclosure.

FIG. 2 is a partial cross-sectional schematic diagram of a partial manufacturing method of an integrated antenna package structure according to a second embodiment of the disclosure. The manufacturing method of the integrated antenna package structure 200 of the present embodiment is similar to the manufacturing method of the integrated antenna package structure 100. As similar components with the same reference numbers have similar functions, materials, or forming techniques, the description thereof is omitted hereinafter.

As shown in FIG. 2, different from the integrated antenna package structure 100, the integrated antenna package structure 200 does not have a shielding layer the same as or similar to the shielding layer 165 described above (since there is no shielding layer, it is not shown or marked).

Figure 3:
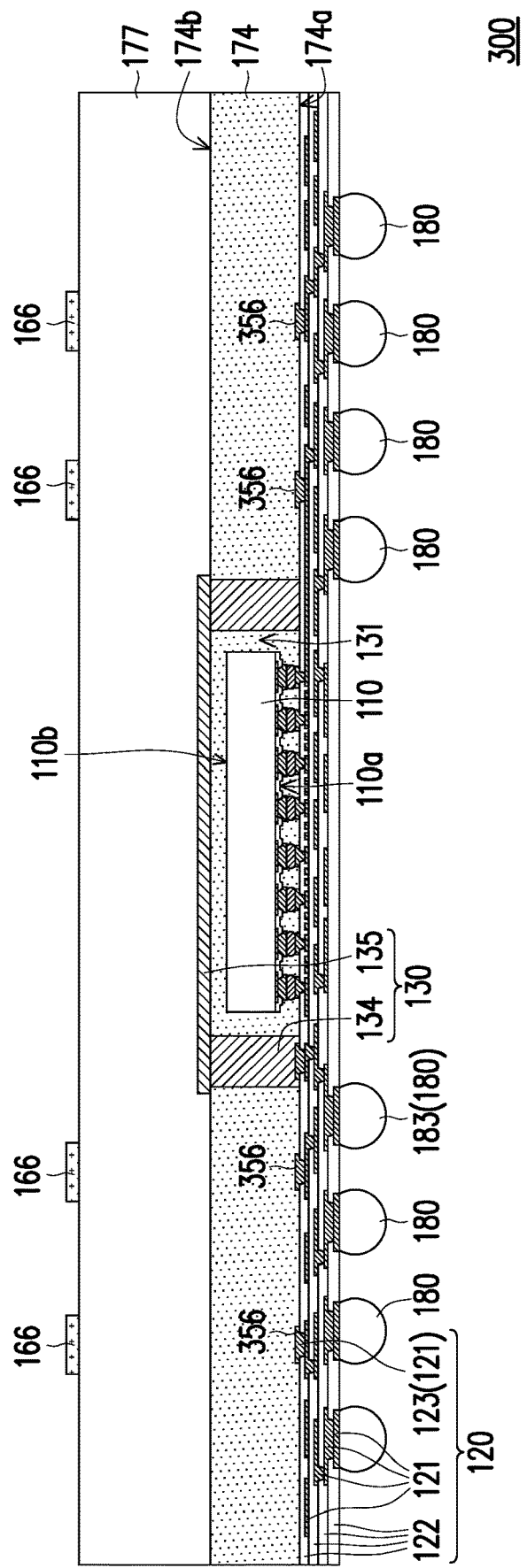
FIG. 3 is a partial cross-sectional schematic diagram of part of a manufacturing method of an integrated antenna package structure according to a third embodiment of the disclosure.

FIG. 3 is a partial cross-sectional schematic diagram of a partial manufacturing method of an integrated antenna package structure according to a third embodiment of the disclosure. The manufacturing method of the integrated antenna package structure 300 of the present embodiment is similar to the manufacturing method of the integrated antenna package structure 100. As similar components with the same reference numbers have similar functions, materials, or forming techniques, the description thereof is omitted hereinafter.

As shown in FIG. 3, the integrated antenna package structure 300 includes a chip 110, a circuit structure 120, a shielding body 130, an encapsulant 174, a first antenna layer 356, a dielectric body 177, and a second antenna layer 166. The first antenna layer 356 is disposed on the circuit structure 120. Antennas in the first antenna layer 356 are electrically connected to corresponding circuits in the circuit structure 120.

In this embodiment, the encapsulant 174 is disposed between the first antenna layer 356 and the dielectric body 177.

In one embodiment, the topmost insulating layer 122 (e.g., an insulating layer 122 closest to the encapsulant 174) in the circuit structure 120 has a plurality of openings, and part of the topmost conductive layer 123 is embedded in the openings. Part of the topmost conductive layer 123 (e.g., a conductive layer 121 closest to the encapsulant 174) in the circuit structure 120 constitutes the first antenna layer 356, but the disclosure is not limited thereto.

To sum up, the integrated antenna package structure and the manufacturing method thereof of the disclosure have small volume and/or good quality.

Finally, it should be noted that the above embodiments serve only to illustrate the technical solutions of the disclosure, and not to limit them. Although the disclosure has been described in detail with reference to these embodiments, those of ordinary skill in the art should understand that it is still possible to modify the technical solutions provided in the embodiments, or to perform equivalent replacements for some or all of the technical features. However, these modifications or substitutions do not deviate the essence of the corresponding technical solutions from the scope of the technical solutions of the embodiments of the disclosure.

What is claimed is:
1. An integrated antenna package structure, comprising:
   a chip;
   a circuit structure electrically connected to the chip;
   a shielding body disposed on the circuit structure and having an accommodating space, wherein the chip is disposed in the accommodating space of the shielding body;
   an encapsulant disposed on the circuit structure and covering the chip;
   a first antenna layer disposed on the circuit structure and electrically connected to the circuit structure;
   a dielectric body disposed on the encapsulant;
   a second antenna layer disposed on the dielectric body; and
   a conductive connector penetrating through the encapsulant, wherein the shielding body comprises:
      a first conductive portion penetrating through the encapsulant and surrounding the chip; and
      a second conductive portion disposed on the encapsulant and overlapping the chip, and wherein:
      the first conductive portion is electrically connected to the second conductive portion, and the first conductive portion and the second conductive portion constitute the accommodating space;

the first antenna layer is electrically connected to the circuit structure by the conductive connector; and a material and a thickness of the first conductive portion are same as a material and a thickness of the conductive connector.

2. The integrated antenna package structure according to claim 1, wherein the first antenna layer and the second conductive portion are from a same film layer.

3. The integrated antenna package structure according to claim 1, further comprising:

a support member penetrating through the encapsulant, wherein a material and a thickness of the support member are same as the material and the thickness of the conductive connector.

4. The integrated antenna package structure according to claim 1, further comprising:

a shielding layer disposed on the dielectric body and overlapping the chip, wherein the shielding layer and the second antenna layer are from a same film layer.

5. The integrated antenna package structure according to claim 4, wherein the second antenna layer comprises a first antenna area and a second antenna area that are electrically separated from each other, and the shielding layer is disposed between the first antenna area and the second antenna area.

6. The integrated antenna package structure according to claim 4, wherein the shielding layer is grounded.

7. A manufacturing method of an integrated antenna package structure, the manufacturing method comprising:

forming a circuit structure;

forming a conductive connector on the circuit structure;

disposing a chip on the circuit structure to be electrically connected with the circuit structure;

forming a shielding body on the circuit structure, wherein the shielding body has an accommodating space, and the chip is disposed in the accommodating space of the shielding body;

forming an encapsulant on the circuit structure to cover the chip;

forming a first antenna layer on the circuit structure to be electrically connected with the circuit structure;

forming a dielectric body on the encapsulant; and forming a second antenna layer on the dielectric body, wherein the shielding body comprises:

a first conductive portion penetrating through the encapsulant and surrounding the chip; and a second conductive portion disposed on the encapsulant and overlapping the chip, and wherein:

the conductive connector penetrates through the encapsulant;

the first conductive portion is electrically connected to the second conductive portion, and the first conductive portion and the second conductive portion constitute the accommodating space;

the first antenna layer is electrically connected to the circuit structure by the conductive connector; and a material and a thickness of the first conductive portion are same as a material and a thickness of the conductive connector.

8. The manufacturing method of the integrated antenna package structure according to claim 7, wherein forming the shielding body and forming the encapsulant comprise:

forming the first conductive portion on the circuit structure;

forming the encapsulant on the circuit structure to cover the chip and laterally cover the first conductive portion;

forming the second conductive portion on the encapsulant that overlaps the chip.

9. The manufacturing method of the integrated antenna package structure according to claim 8, wherein the first antenna layer and the second conductive portion are formed by same processes.

10. The manufacturing method of the integrated antenna package structure according to claim 8,
wherein
after the encapsulant is formed, the encapsulant further laterally covers the conductive connector;
after the first antenna layer is formed, the first antenna layer is electrically connected to the circuit structure through the conductive connector; and
the conductive connector and the first conductive portion are formed by same processes.

11. The manufacturing method of the integrated antenna package structure according to claim 10, further comprising:
forming a support member on the circuit structure,
wherein
after the encapsulant is formed, the encapsulant further laterally covers the support member; and
the support member and the conductive connector are formed by same processes.

12. The manufacturing method of the integrated antenna package structure according to claim 7, wherein forming the first antenna layer precedes forming the encapsulant.

13. The manufacturing method of the integrated antenna package structure according to claim 7, further comprising:
forming a shielding layer on the dielectric body to overlap the chip, wherein the shielding layer and the second antenna layer are formed by same processes.

14. The integrated antenna package structure according to claim 1, wherein a portion of the encapsulant is disposed between the chip and the shielding body.

15. The integrated antenna package structure according to claim 3, wherein:
the support member does not overlap the first antenna layer;
the support member does not overlap the second antenna layer;
the support member is a dummy component for signal processing or signal transmission; or
the support member is electrically connected to the shielding body.

16. An integrated antenna package structure, comprising:
a chip;
a circuit structure electrically connected to the chip;
a shielding body disposed on the circuit structure and having an accommodating space, wherein the chip is disposed in the accommodating space of the shielding body;
an encapsulant disposed on the circuit structure and covering the chip;
a first antenna layer disposed on the circuit structure and electrically connected to the circuit structure;
a dielectric body disposed on the encapsulant; and
a second antenna layer disposed on the dielectric body, wherein the encapsulant is disposed between the first antenna layer and the dielectric body.

17. The integrated antenna package structure according to claim 16, wherein the shielding body comprises:
a first conductive portion penetrating through the encapsulant and surrounding the chip; and
a second conductive portion disposed on the encapsulant and overlapping the chip, wherein the first conductive portion is electrically connected to the second conductive portion, and the first conductive portion and the second conductive portion constitute the accommodating space.

\* \* \* \* \*